United States Patent [19]

Dolby

[11] Patent Number: 4,766,395
[45] Date of Patent: Aug. 23, 1988

[54] CIRCUITS TO PROVIDE DESIRED CONDUCTANCE CHARACTERISTICS USING A FET

[76] Inventor: Ray M. Dolby, 3340 Jackson St., San Francisco, Calif. 94118

[21] Appl. No.: 914,481

[22] Filed: Oct. 7, 1986

Related U.S. Application Data

[63] Continuation-in-part of Ser. No. 787,637, Oct. 15, 1985, abandoned.

[51] Int. Cl.⁴ .............................................. H03G 5/22
[52] U.S. Cl. .................................... 330/284; 330/149; 330/145; 330/305; 330/306; 333/14
[58] Field of Search ............. 330/149, 145, 277, 279, 330/282, 284, 296, 305, 306; 307/264, 493, 494, 503; 381/106; 333/14; 455/72

[56] References Cited

U.S. PATENT DOCUMENTS

3,710,270 1/1973 Addis et al. .................... 330/279
4,137,466 1/1979 Schemmel et al. ............ 330/282 X
4,223,274 9/1980 Paulke et al. .................... 330/279 X

*Primary Examiner*—James B. Mullins
*Attorney, Agent, or Firm*—Majestic, Gallagher, Parsons & Siebert

[57] ABSTRACT

The drain-source conductance of a wide variety of FETs can be made to conform to a predetermined function of a control signal. The control signal is multiplied by a factor and an offset is added or subtracted therefrom to derive a modified control signal. The modified control signal is then applied to the gate of a FET. The factor and the offset are such that the drain-source conductance of the transistor is substantially the predetermined function of the control signal. When a desired attenuator characteristic defined with respect to a FET is to be provided using a FET having characteristics different from those of the reference FET, the control signal to the FET used can be similarly modified so that the desired attenuator characteristics are obtained. A dual path compressor or expander employing an attenuator (which includes a FET) in its further path can be made to conform to a desired compression or expansion characteristic defined with respect to a similar arrangement and with respect to a reference FET conductance control characteristic. This can be accomplished by making the conductance control characteristics of the FET to be used to conform to the desired conductance control characteristic.

45 Claims, 3 Drawing Sheets

CIRCUITS TO PROVIDE DESIRED CONDUCTANCE CHARACTERISTICS USING A FET

CROSS REFERENCE TO RELATED APPLICATION

This application is a continuation-in-part application of co-pending patent application Ser. No 787,637, filed Oct. 15, 1985 by Ray M. Dolby and now abandoned.

BACKGROUND OF THE INVENTION

This invention relates in general to attenuator circuits employing a field effect transistor (FET) and more specifically to a circuit employing an impedance and a FET, where the FET provides a conductance as a desired predetermined function of a control signal, in order to provide a standardized gain control or frequency response characteristic.

Three terminal field effect transistors have been used frequently to provide variable conductances where the conductances between the source and drain are controlled by control signals applied to the gates of the FETs. The drain-source conductances of most FETs vary linearly with the control voltage applied across the source and gate so that incremental changes in the control voltage will cause proportional incremental changes in their conductances. The variation of the drain-source conductance of a FET as a function of the control signal is known as the conductance control characteristic of the FET.

Field effect transistors used as variable conductances have been employed in signal attenuators. For example, they have been used in limiters for noise reduction systems where compressors and expanders require controlled limiting of the amplitude of a signal. In U.S. Pat. No. 4,490,691, a field effect transistor is used in conjunction with a capacitor to form a high pass filter with a sliding band type high frequency shelf response whose corner frequency varies as a function of the control signal to the gate of the transistor. In this particular high pass filter circuit the drain-source path of the FET shunts the signal to be limited to ground. In other attenuator or limiter circuits, the drain-source conductance of the FET may be placed in the series path of the signal instead of in a shunt path. A FET can be used in conjunction with an inductor to form a sliding band circuit with a low frequency band pass response operating downwardly. A FET may also be used in conjunction with a resistor and another filter to form a fixed band attenuator circuit whose frequency range does not change, in contrast to the sliding band filter circuits. In each of the above types of attenuators, the characteristics of the attenuator are varied by varying the conductance of the drain-source path of the FET.

In many attenuator, limiter and filter circuits it is important for the circuits to have precise and reproducible characteristics. For noise reduction systems employing complementary compressors and expanders, for example, it is important for the signal limiters and filters in a group of matching compressors (or expanders) to have similar characteristics. This enables the original uncompressed signal to be recovered by any expander complementary to the group of compressors from a compressed signal compressed by a compressor in the group, and enables the use of any matching compressor to produce the compressed signal.

In order that the signal attenuators, limiters or sliding band circuits in the compressors (or expanders) have similar signal attenuating characteristics, it is desirable for the FETs in such circuits to have similar conductance control characteristics. In other words, the conductances of the FETs in the different limiter circuits in the compressors (or expanders) are preferably the same in response to the same control signals. It is well known that the conductance control characteristics of FETs vary widely, so that different FETs may have very different conductances even though the same control signal is applied to their gates. It is therefore desirable to select or fabricate FETs or otherwise provide FET circuits which will have the same conductance in response to the same control signal.

Until now, the favorite method for providing FETs having the same conductance control characteristic is to use special manufacturing processes which may be expensive and difficult. Simpler and less expensive methods are thus desirable. In a method employed by Dolby Laboratories of San Francisco, Calif. to provide reproducible FET conductance control characteristics, the FETs used are selected so that a control signal fed to their gates will produce essentially the same conductances. Then, offset voltages are applied where necessary to compensate for the difference in pinch-off voltages of the selected FETs.

In U.S. Pat. No. 3,818,244 and 3,737,678 to Dolby et al, reproducibility of FET conductance control characteristics is improved by employing two FETs with pinch-off voltages selected to be identical to provide the attenuation required through two stages. The first FET provides the first few dB of attenuation, with most of the remaining required attenuation provided by the second FET, the two FETs having different thresholds of control voltage at which they start to conduct. A high degree of repeatability is achieved even at high values of attenuation because the first FET is fully conducting after the first few dB of attenuation, giving an accurate value of first stage attenuation.

In U.S. Pat. No. 2,035,263, Cushman et al. propose to use two identical variable resistance devices controlled in the same manner by the same control signal to provide a compression or expansion ratio of 2:1. In other words, for devices having a wide variety of conductance control characteristics, a precise and reproducible compression or expansion ratio of 2:1 can be achieved so long as the two variable resistance devices used in the compressor or expander are identical and identically controlled. In such manner matching companders can be produced even though the characteristics of variable resistance devices in one compander do not match those of devices in a different compander. Any number of variable resistance devices may be employed to provide different fractional compression and expansion ratios.

In the article "Compander Increases Dynamic Range" by Wermuth, *db Magazine*, June 1976, the use of three identical FETs (FIG. 8) is proposed in a scheme similar to that of Cushman et al's to achieve a compression ratio of 2:3 or by 33% on a logarithmic scale; the scheme enables the characteristic to be reproducible. In U.S. Pat. No. 3,969,680 Wermuth proposes the use of two identical FETs in another similar scheme to provide constant slope 2:1 compression and expansion.

None of the above described conventional methods is entirely satisfactory. In some methods the FETs used must be selected from a limited group. For companders using identical devices, special manufacturing may again be required to produce these devices. Furthermore, the transient response of such companders may deviate significantly from the constant ratio in a manner dependent on the actual conductance control characteristics of the identical loss devices.

SUMMARY OF THE INVENTION

This invention is based on the recognition that the drain-source conductance of a wide variety of FETs can be made to conform to a predetermined function of a control signal by first modifying the control signal. The modified control signal is then applied to the gate of a FET. The modified control signal is derived in accordance with the desired predetermined function and the actual characteristics of the FET. When the modified control signal is applied to the FET gate, the drain-source conductance of the FET conforms to a predetermined function of the original unmodified control signal.

The invention is directed to a circuit for providing a desired conductance as a predetermined function of a control signal. The circuit comprises a field effect transistor whose drain-source conductance is a second function of the gate-source voltage. The circuit further comprises means for providing a modified control signal by multiplying the control signal by a factor and adding or subtracting therefrom an offset. The modified control signal is applied to the gate of the transistor. The factor and the offset are such that the drain-source conductance of the transistor is substantially the predetermined function of the control signal.

The circuit of the invention may be used to cause the drain-source conductance of practically any FET to conform to a predetermined function of a control signal. No special type of FET or special manufactureing processes are required, so that attenuators, filters or other devices requiring FETs with reproducible conductance control characteristics may be produced cheaply and conveniently.

Another aspect of the invention enables an attenuator circuit employing a FET and an impedance to provide attenuation which conforms to a desired and predetermined characteristic. This aspect is directed towards a circuit for providing a desired attenuator characteristic, where the desired characteristic is defined with respect to a reference field effect transistor whose drain-source conductance is a predetermined function of a control voltage $V_C$ applied to the gate of the reference transistor, and where the predetermined function is of the form $F(c(V_C-V_T))$; c, $V_T$ being desired constants and F a selected function.

The circuit for providing a desired attenuator characteristic comprises an impedance means and a second field effect transistor whose drain-source conductance is substantially a function $F(a(V_{GS}-V_P))$ of its gate-source voltage $V_{GS}$, where constants a, V are different from the desired constants c, $V_T$. The circuit further comprises means for providing a modified control signal by multiplying the control signal $V_C$ by a factor c/a and adding thereto an offset $(V_P-c/aV_T)$. The modified control signal is then applied to the gate of the second transistor. The multiplying factor and the offset are such that the drain-source conductance of the second transistor is substantially the predetermined function of the control signal. This causes the circuit characteristic to conform to the desired predetermined attenuator characteristic.

Yet another aspect of the invention is directed to circuits having a main path and a further path in a "dual path" arrangement, where the circuits provide compression or expansion which conforms to a desired and predetermined characteristic. This aspect is directed towards a circuit for providing a desired compression or expansion characteristic where the characteristic is defined with respect to a field effect transistor whose drain-source conductance is a predetermined function of a control signal $V_C$ applied to the gate of the reference transistor, said function being of the form $F(c(V_C-V_T))$, where c and V are desired constants and F a selected function. The circuit comprises a main signal path which is substantially linear with respect to dynamic range and a further signal path which has its input coupled to the input or output of the main path.

The further path includes (a) a second field effect transistor whose drain-source conductance is substantially a function $F(a(V_{GS}-V_P))$ of its gate-source voltage $V_{GS}$, wherein constants a and $V_P$ are different from the desired constants c and $V_T$ respectively; (b) an impedance means; and (c) means for providing a modified control signal by multiplying the control signal $V_C$ by a factor and adding thereto an offset, said modified control signal being applied to the gate of the second transistor, said factor and said offset being such that the drain-source conductance of the transistor is substantially the predetermined function of the control signal.

Where the circuit is a compressor, the circuit further comprises means in the main signal path for adding the outputs of the main and further paths. Where the circuit is an expander, the circuit further comprises means in the main signal path for subtracting the outputs of the main and further paths.

DESCRIPTION OF THE INVENTION

Figures 1A, 2A:
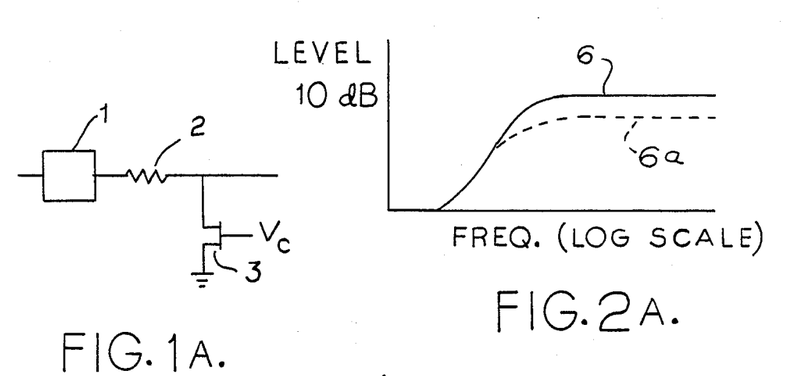
FIGS. 1A, 1B, 1C are schematic circuit diagrams of three types of attenuator or filter circuits useful in illustrating the invention.
FIGS. 2A, 2B, 2C are graphical illustrations of the signal transmission characteristics of the circuits of Figs. 1A, 1B, 1C respectively.

FIG. 1A is a schematic circuit diagram illustrating a fixed band attenuator. As shown in FIG. 1A, the fixed band attenuator comprises a filter 1 and a voltage divider comprising resistor 2 and a field effect transistor 3. The drain-source resistance of transistor 3 is variable as a function of control voltage $V_C$. The frequency response characteristic curve 6 of the circuit of FIG. 1A is illustrated in FIG. 2A, where fixed filter 1 is assumed to be a high pass filter with a fixed high frequency shelf response. Thus, the effect of the voltage divider circuit comprising resistor 2 and FET 3 is to move the level of the shelf 6 vertically, such as to a position 6a shown in dotted line in FIG. 2A. Thus, the amount of attenuation applied by the circuit in the pass band is controlled by the drain-source resistance of the FET, where the resistance is in turn controlled by control signal $V_C$; the corner frequency of the high frequency shelf 6 does not change with changes in the control signal $V_C$.

Figures 1B, 2B:
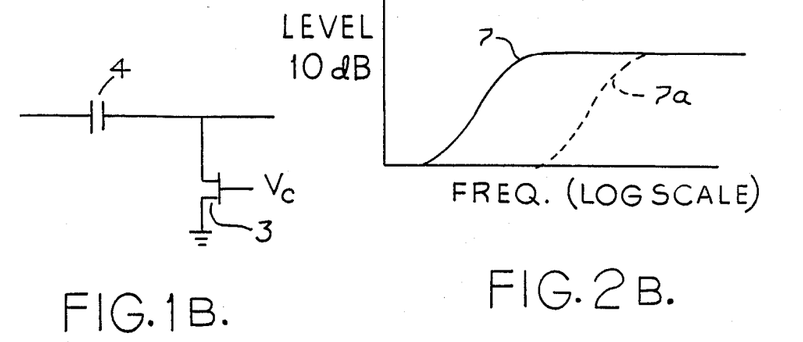

FIG. 1B is a schematic circuit diagram illustrating a sliding band high pass filter comprising FET 3 and capacitor 4 arranged as shown. The characteristics of the circuit of FIG. 1B are illustrated in FIG. 2B. The characteristic curve 7, as shown in FIG. 2B, is in the shape of a high frequency shelf whose corner frequency may slide upwards as a function of the control signal $V_C$. Thus, as shown in FIG. 2B, depending on the control signal $V_C$, the characteristic curve of the circuit may shift upwards to a position shown in dotted line 7a.

Figures 1C, 2C:
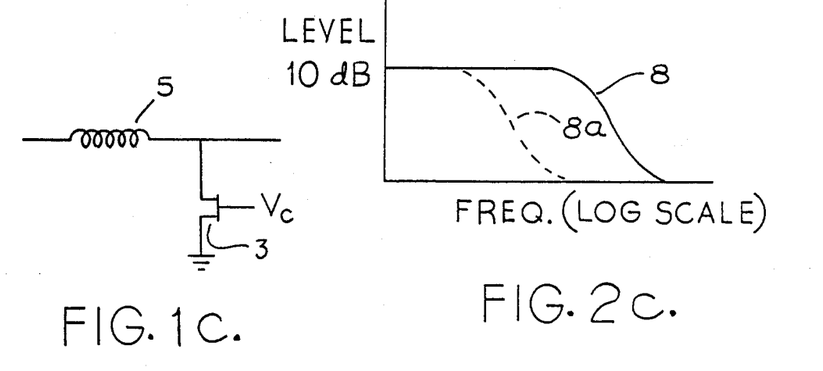

FIG. 1C is a schematic circuit diagram of a sliding band low pass filter comprising FET 3 and an inductor 5 (simulated by a gyrator circuit as a practical matter). Its characteristics are illustrated in FIG. 2C. As shown in FIG. 2C, characteristic curve 8 of the circuit is in the shape of a low frequency shelf whose corner frequency may slide downwardly as a function of the control signal $V_C$. Depending on the signal $V_C$, the characteristic curve of the circuit of FIG. 1C may shift to the left to a position shown in dotted line 8a.

In the circuit of FIG. 1A, the amount of attenuation in the pass band is controlled by $V_C$, which causes the drain-source resistance of the FET to vary without changing the corner frequency. In the circuit of FIG. 1B, control signal $V_C$ controls the time constant of the circuit and therefore the sliding action described above by controlling the drain-source resistance of FET 3. In the circuit of FIG. 1C, control signal $V_C$ controls the sliding action by varying the drain-source resistance of FET 3. The drain-source resistance of a FET is simply the reciprocal of its drain-source conductance. In other words, the attenuation characteristics of the circuits of FIGS. 1A–1C depend on the conductance control characteristics of the FETs in such circuits.

As discussed above in the Background of the Invention, it is desirable for signal attenuators in a group of matching compressors (or expanders) to have substantially identical characteristics. Since different FETs may have very different conductance control characteristics, their drain-source resistances may be very different even though the same control signal is applied to their gates. It is therefore desirable to provide circuits which can cause the conductance control characteristic of any FET to conform to a desired predetermined characteristic. Thus, even though FETs having very different conductance control characteristics are used in the attenuator circuits described above, the attenuation applied can be made to conform to a desired and predetermined characteristic.

The aspect of the invention directed to conforming the conductance control characteristics of FETs to a predetermined characteristic is described below in reference to FIGS. 3A, 3B, 4–7. It is known that the drain-source conductance of a FET is proportional to the quantity $$V_{GS} - V_{DS}/2 - V_T,$$

where, $V_{GS}$ is the gate-source voltage,
$V_{DS}$ is the drain-source voltage, and
$V_T$ is a threshold voltage of the FET.

The distortion term $V_{DS}/2$ in the expression above will be dealt with later and may be neglected for now so that the drain-source conductance G may be expressed as follows:

$$G = c(V_{GS} - V_T)$$

where c is a constant characteristic of a particular FET. Thus, if a control voltage $V_C$ is applied to the gate of the FET with its source grounded, the conductance G is given by:

$$G = c(V_C - V_T)$$

The desired conductance control characteristic of the FET is thus in the shape of a straight line the slope of which determines the scale for the change in drain-source conductance of the FET when the control voltage $V_C$ changes. The desired conductance control characteristic is illustrated in FIG. 3A.

Figure 3A:
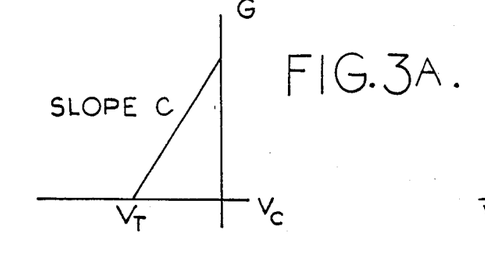
FIG. 3A is a graphical illustration of the drain-source conductance G as a desired predetermined function of a control signal $V_C$.

In many applications such as in noise reduction systems employing precisely controlled compression and expansion, it is desirable to provide conductances which are predetermined functions of a control signal, such as that shown in FIG. 3A. However, it is difficult to manufacture a large number of FETs having the same desired conductance control characteristic. It is therefore desirable to provide for a circuit which, when used in conjunction with any FET having a conductance control characteristic different from the one desired, will cause the FET to provide a conductance which varies in accordance with the desired characteristic. One such FET may for example have the characteristic shown in FIG. 3B. A comparison of FIGS. 3A and 3B will show that the FET of FIG. 3B has a conductance control characteristic very different from the desired characteristic of FIG. 3A.

Figure 3B:
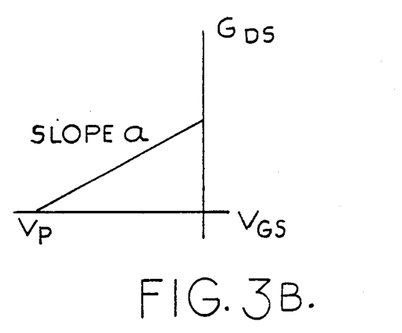
FIG. 3B is a graphical illustration of the drain-source conductance $G_{DS}$ of a particular FET as a function of the gate voltage $V_{GS}$.

This invention is based on the recognition that given any FET whose conductance control characteristic takes on the same general function or dependence upon a control signal as that desired, a circuit may be provided to modify the control signal applied to the FET gate so that the FET will have the desired conductance control characteristic. The conductance of the FET must take on the same general form of functional dependence upon a control signal. Thus, if the desired conductance control characteristic is in the form of a straight line as shown in FIG. 3A, the conductance control characteristic of the FET employed must also be a straight line. The conductance control characteristic of the FET illustrated in FIG. 3B may be represented as follows:

$$G_{DS} = a(V_{GS} - V_P)$$

where
a is a constant characteristic of the FET and
$V_P$ is the pinch-off voltage of the FET.

In order that the drain-source conductance $G_{DS}$ be the same as the desired conductance G of FIG. 3A the following must hold:

$$a(V_{GS}-V_P)=c(V_C-V_T)$$

or, $$V_{GS}=c/a\,(V_C-V_T)+V_P$$

Thus, if the control voltage $V_C$ is applied between the gate and source of the FET of FIG. 3B, then the conductance control characteristic as illustrated in FIG. 3B will be obtained. If, however, instead of applying the control voltage V between the gate and source of the FET, a modified control voltage $V_{GS}$ given by the above equation is applied instead, the drain-source conductance $G_{DS}$ will be equal to the conductance G having the desired characteristic dependence on $V_C$.

Figure 4:
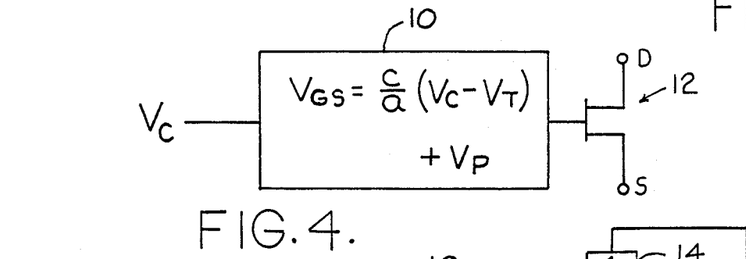
FIG. 4 is a block diagram of a circuit for modifying the control signal $V_C$ so that, when the modified control signal is applied to the gate of the FET with conductance control characteristics as shown in FIG. 3B, substantially the desired predetermined conductance control characteristics of FIG. 3A will be obtained.

FIG. 4 is a block diagram of a circuit for modifying the control voltage before application to the FET so that the FET will have the desired conductance control characteristic. As shown in FIG. 4, circuit 10 modifies the control voltage $V_C$ so that when the modified control voltage $V_{GS}$ is applied between the gate and source of the FET 12, the drain-source conductance of FET 12 will have the desired control characteristic dependence on $V_C$.

Figure 5:
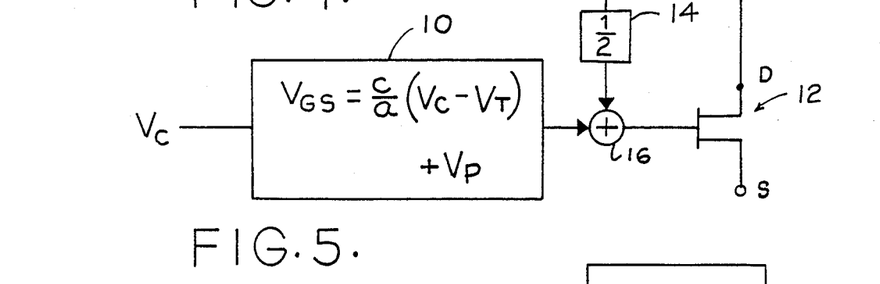
FIG. 5 is the block diagram of FIG. 4 and of a circuit for reducing signal distortion.

FIG. 5 is a block diagram incorporating the circuit of FIG. 4 together with a circuit for reducing distortion. As shown in FIG. 5 the drain-source voltage across the FET 12 is first reduced to half of its instantaneous magnitude by circuit 14 and then added to the modified control voltage $V_{GS}$ before application to the gate of the FET. The application of half the drain-source voltage to the gate of the FET is conventionally employed to reduce distortion. This corresponds to the distortion term in the general expression for the conductance of the FET above.

Figure 6:
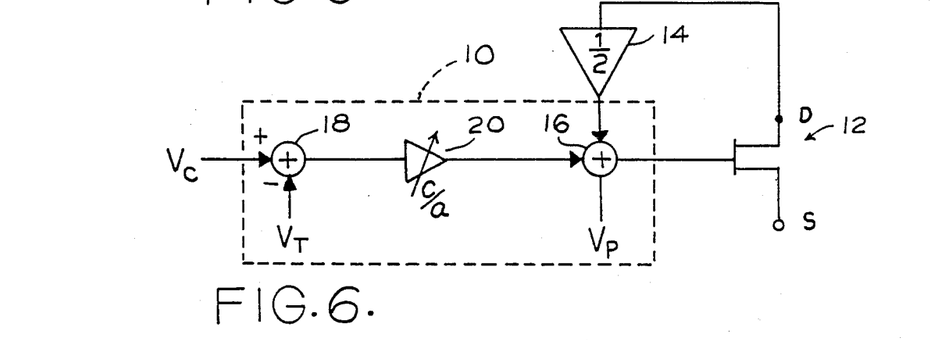
FIG. 6 is a block circuit diagram of an implementation of the circuit of FIG. 5.

FIG. 6 is a schematic circuit diagram illustrating an implementation of the circuit of FIG. 5. As shown in FIG. 6. the pinch-off voltage $V_T$ of the desired conductance control characteristic is first subtracted from the control voltage by adder 18. The difference voltage is then supplied to a variable gain amplifier 20 which multiplies the difference voltage by the factor c/a. The output of amplifier 20 is then added to $V_P$, the actual pinch-off voltage of FET 12, to obtain the modified control signal $V_{GS}$ of circuit 10 of FIG. 5. However, since the modified control signal is to be added also to the half of the drain-source voltage $V_{DS}$ of FET 12 by adder 16, an additional adder may be eliminated by having the two additions performed together by adder 16, adding together the three quantities in adder 16: c/a $(V_C-V_T)$, $V_P$, ½ $V_{DS}$. As shown in FIG. 6 an amplifier having the gain of half is used for the multiplier 14 to provide a low input impedance for adder 16.

Given a FET 12 having a conductance control characteristic of a straight line in the form of FIG. 3B, the adjustable elements in circuit 10 may be easily adjusted so that the drain-source conductance of FET 12 conforms substantially to that desired. The quantities $V_T$ and c are known since they characterize the desired conductance control characteristic. The actual pinch-off voltage of FET 12, $V_P$, can be found by simple testing. Thus, all the settings of circuit 10 are known except for the quantity a. Therefore, to complete the calibration of FET 12, the gain of amplifier 20 is adjusted until the drain-source conductance of FET 12 conforms to that required at a particular value of the control voltage $V_C$. The calibration of FET 12 is then complete.

Figure 7:
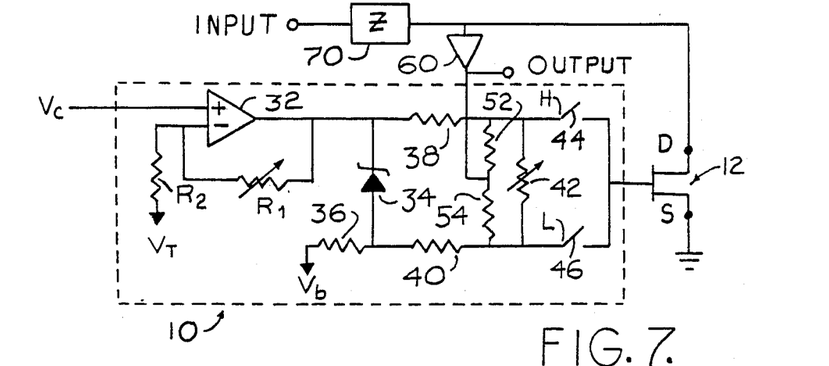
FIG. 7 is a schematic circuit diagram of a practical implementation of the circuit of FIG. 5, illustrating the preferred embodiment of the invention.

FIG. 7 is a schematic circuit diagram of a practical implementation of the circuit of FIG. 5 to illustrate the preferred embodiment of the invention. As shown in FIG. 7, the control voltage $V_C$ is fed to the non-inverting input of an amplifier 32. The inverting input of the amplifier is biased by a DC voltage equal to the desired pinch-off voltage $V_T$ through a resistor $R_2$. The output of the amplifier 32 is fed back to the inverting input through an adjustable resistor $R_1$. The output of amplifier 32 is given by the expression below:

$$(R_1+R_2)\,(V_C-V_T)/R_2+V_T$$

The voltage divider circuit comprising Zener diode 34, biasing voltage $V_b$, biasing resistor 36 and voltage divider resistors 38, 40, 42, adds the offset voltage $(V_P-V_T)$ to the output of amplifier 32. Hence, if the ratio $(R_1+R_2)/R_2$ is equal to the ratio c/a, then the voltage applied across the gate and source of FET 12 in FIG. 7 is given by the equation of circuit 10 in FIG. 5. Voltage $V_b$ and biasing resistor 36 bias the Zener diode into conduction. Zener diode 34 provides a substantially constant DC voltage drop between its cathode and anode. Such voltage drop is divided by the divider resistors 38, 40, 42 to provide offsets at the points H, L to generate the offset $(V_P-V_T)$. Thus, if connection 44 at point H is made, the offset provided is equal to the voltage drop across Zener diode 34 multiplied by the ratio given by the resistance of resistor 38 divided by the sum of the resistances of resistors 38, 40 and 42. If connection 46 is made at point L instead, the offset applied is given by the voltage drop across diode 34 multiplied by the ratio of the sum of the resistances of resistors 38, 42 to that of resistors 38, 40 and 42. Either one of the two connections 44, 46 may be made depending on the magnitude of $(V_P-V_T)$ required.

Resistors 38 and 40 may conveniently have substantially the same resistance. Then, if the resistance of resistor 42 is zero, both points H, L are at half the voltage drop of the Zener diode. When the resistance of resistor 42 is increased from zero, the voltage at H increases and that at L decreases from such half voltage drop value. Thus, if the magnitude of the offset required is greater than half the voltage drop across diode 34, connection 44 is made. If instead the offset is less than half the voltage drop across diode 34, connection 46 is made instead. Then the resistance of resistor 42 may be adjusted until the voltage at H or L reaches the required offset value. Zener diode 34 may be chosen so that its voltage drop is optimum for the variation in the offset voltage required.

The voltage across the drain and source of FET 12 is amplified by amplifier 60 and then applied through resistors 52, 54 to points H and L, respectively. Resistors 52 and 54 have substantially the same resistance which is of such a value that the AC components of the voltages at points H and L are substantially half of $V_{DS}$. As a practical matter, significant signal amplification, e.g. 20 dB, may be used in amplifier 60. The values of resistors 52 and 54 are then increased accordingly so as to maintain half of $V_{DS}$ at the FET gate. Configured as shown in FIG. 7 it will be observed that the generation of the offset voltage $(V_P-V_T)$ does not affect the application of the distortion compensation voltage $V_{DS}/2$ and visa versa. Furthermore, the distortion compensation voltage $V_{DS}/2$ applied is unaffected by whether connection 44 or connection 46 is made. The input signal is fed to the drain of FET 12 through an impedance 70, and the signal output is taken from the output of amplifier 60.

FET 12 may be calibrated using the circuit of FIG. 7 by a simple procedure. First, either one of the two connections 44, 46 is made depending on the expected value of the offset voltage $(V_P-V_T)$. Then $R_1$ and the value of resistor 42 are adjusted by a process of successive approximation until the drain-source conductance of FET 12 conforms to the desired conductance control characteristic. If the value of $V_T$ is set to provide a bias at the inverting terminal of amplifier 32, this bias corresponding to the FET gate pinch-off voltage, then the adjustment process becomes essentially non-iterative (i.e. convergence is rapid). Resistor 42 (bias) is set to give the lower conduction point. Resistor $R_1$ (gain) then calibrates the higher conduction point. If necessary, resistor 42 may be retrimmed and $R_1$ rechecked at the lower and higher conduction points respectively.

While the invention is described above in reference to FETs whose drain-source conductances are linear functions of the control voltage, it will be understood that the invention is also applicable to those in which the conductance is not a perfectly linear function of the control voltage. Thus, if the desired conductance control characteristic of a FET is given by:

$$G=F_1[c(V_C-V_T)],$$

the circuit of the invention is applicable to any FET whose conductance is given by:
$$G=F_2[a(V_{GS}-V_P)],$$

provided that $F_1$ is substantially the same as $F_2$.

The variable conductance of a FET conforming to a desired conductance control characteristic may be used in the signal path to attenuate the signal to a desired degree. Alternatively, it may be placed in a shunt path, shunting the signal to ground or to another terminal to attenuate the signal to the desired degree. A balanced circuit may be used if desired, the FET being connected there across. It may also be used together with a capacitance or inductance to form a high pass or a low pass filter with a variable corner frequency. Such configurations are useful in compressors and expanders in noise reduction circuits. All such arrangements are within the scope of this invention.

Figure 8:
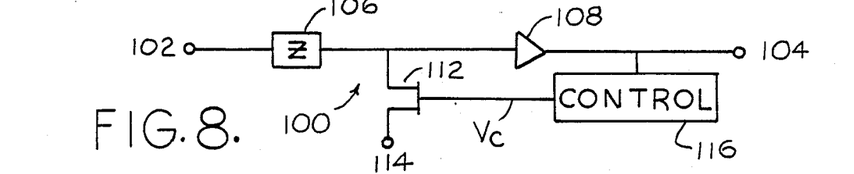
FIG. 8 is a schematic circuit diagram of an attenuator circuit useful in compressors and expanders.

FIG. 8 is a schematic circuit diagram of a signal attenuator useful in compressors and expanders. As described in detail in U.S. Pat. No. 3,846,719; U.S. Pat. No. 3,903,485; U.S. Pat. No. 4,490,691 and U.S. Pat. No. Re. 28,426, audio noise reduction systems advantageously employed "dual path" arrangements. A "dual path" arrangement is one in which a compression or expansion characteristic is achieved through the use of a main path which is essentially free of dynamic action and one or more secondary or side paths having dynamic action. The side path or paths take their input from the input or output of the main path and the output or outputs are additively or subtractively combined with the main path in order to provide compression or expansion. Generally, a side path provides a type of limiting or variable attenuation and the manner in which it is connected to the main path determines if it boosts (to provide compression) or bucks (to provide expansion) the main path signal components. Circuit 100 of FIG. 8 may be advantageously used in the side path of a dual path arrangement to provide the desired compression or expansion.

Signal attenuator 100 of FIG. 8 comprises an input port 102, an output port 104, an impedance 106 and a buffer 108 connected between the input and the output. The output of impedance 106 is shunted by the drain-source path of a FET 112 to a port 114. The gate of FET 112 is controlled by a control signal $V_C$ derived by a control circuit 116 from the output 104 and fed back to the gate of the transistor. Control circuit 116 may be a rectifier and smoothing circuit. Thus, the output signal at output 104 controls the shunting action of FET 112 by the feedback loop through control circuit 116.

If impedance 106 is a resistor, then resistor 106 and the drain-source path of FET 112 forms a voltage divider where the signal attenuation may be simply varied by varying the drain-source resistance of FET 112. As discussed above in reference to FIGS. 1A, 2A, circuit 100 (where impedance 106 is a resistor), when used with another high pass filter (not shown in FIG. 8), forms a fixed band filter with characteristics as shown in FIG. 2A. Thus, variation in the drain-source resistance of the FET 112 will simply cause the level of the high frequency shelf in FIG. 2A to shift vertically, without changing the corner frequency.

Where impedance 106 is a capacitor, circuit 100 is a sliding band high pass filter with characteristics illustrated in FIG. 2B. Where impedance 106 is an inductor (simulated as a practical matter by a gyrator circuit), circuit 100 is a sliding band low pass filter with characteristics illustrated in FIG. 2C. Where the impedance 106 is a capacitor or an inductor, the sliding action of the filter is controlled by the drain-source resistance of the FET. Thus, irrespective of whether impedance 106 is a resistor, inductor or capacitor, in order for signal attenuator 100 to provide the desired attenuation characteristics, it is necessary for the drain-source conductance characteristic of FET 112 to conform to a desired and predetermined reference characteristic.

For the purpose of discussion, it is assumed that the desired conductance control characteristic of a reference FET 112 is given by:

$$G=F[c(V_C-V_T)],$$

where c, $V_T$ are desired constants and F is a selected function. Then, as shown above, the conductance control characteristics of any FET can be made to conform to the desired conductance control characteristic of reference FET 112 by means of the modifying circuit 10 of FIGS. 4–7, provided that the conductance control characteristic of such FET is substantially of the form:

$$G=F[a(V_{GS}-V_P)],$$

where a, $V_P$ are constants and V is the gate-source voltage of such FET. For most FETs, their conductance control characteristics are linear so that their conductance control characteristics are of the form:

$$G=[a(V_{GS}-V_P)].$$

While, for the purpose of discussion, a reference FET is used to define the desired attenuator characteristics, it will be understood that as a practical matter no reference FET is necessary so long as the desired conductance control characteristics for the FET to be used are known. This information may then be used as shown below to cause an attenuator circuit using any FET having the same functional dependence on control signals to have substantially the desired characteristics.

Figure 9:
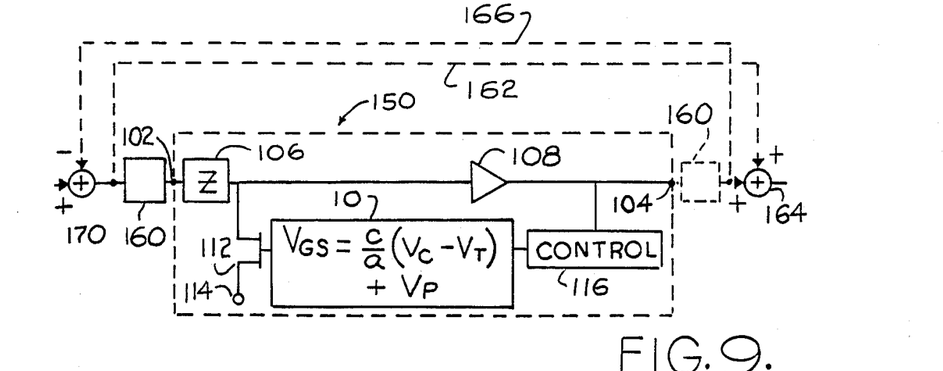
FIG. 9 is a schematic circuit diagram illustrating the preferred embodiment of the invention.

FIG. 9 is a schematic circuit diagram of a signal attenuator illustrating another aspect of the invention. Attenuator circuit 150 includes the impedance 106, buffer 108 and control circuit 116 of FIG. 8. FET 152, however, has conductance control characteristics that are different from the desired reference characteristic. In order that circuit 150 will provide the same attenuation characteristics as circuit 100 of FIG. 8, a circuit 10 is employed to modify the control signal $V_C$ from control circuit 116; the modified control signal $V_{GS}$ is then applied to the gate of FET 152. As shown above, circuit 10 will cause the conductance control characteristics of FET 152 to conform to that of the reference characteristic (e.g. that of FET 112). Hence, the attenuation circuit 150 will have essentially the same attenuation characteristics as circuit 100 of FIG. 8.

In certain compressor and expander circuit arrangements, it may be desirable to divide the audio spectrum into a plurality of frequency bands, each of which is acted upon independently. In that way, a dominant signal component affects dynamic action (compression or expansion) only within a portion of the overall spectrum, in contrast to a wideband approach in which dynamic action throughout the entire spectrum is affected by a dominant signal component. In such bandsplitting approach, it may be desirable to employ a filter in the side path circuit. As shown in FIG. 9, a filter 160 may be used to filter the input signal of circuit 150. Filter 160 may be a band pass filter, a low pass filter or a high pass filter. Alternatively filter 160 may be placed at the output of circuit 150 to filter its output instead as shown in phantom in FIG. 9. Where circuit 150 is used in a side path of a low frequency stage of a bandsplitting arrangement, it is preferable for the low pass filter in the side path to be placed at the output of circuit 150. When placed at such position, the low pass filter assists in suppressing undesired noise or distortion generated in the low frequency stage.

As shown in FIG. 9, the side or further path comprising circuit 150 may be combined with a main path 162 shown in dotted line and adder 164 in the main path to form a compressor. Thus adder 164 adds the outputs of both the main and further paths to give the output of the compressor. In the compressor combination, it will be noted that the input of the further path is coupled to the input of the main path. Alternatively, the further path comprising circuit 150 may be combined with main path 166 shown in dotted line and adder 170 in the main path to form an expander. Adder 170 subtracts the output of the further path from the output of the main path to give the expander output. It will be noted that the input of the further path in the expander is coupled, not to the input of the main path, but to its output instead. The compressor and expander described above are referred to as the Type I compressor and expander in U.S. Pat. No. 3,903,485 to the applicant.

Figure 10:
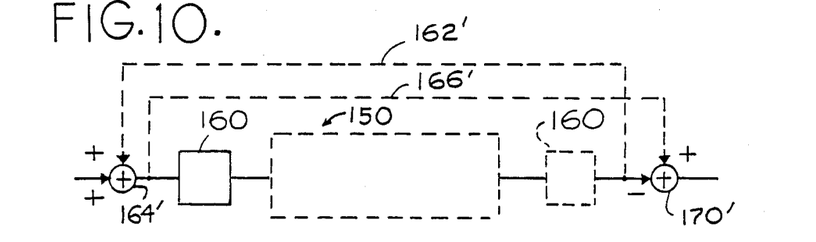
FIG. 10 is a schematic circuit diagram illustrating an alternative embodiment of the invention.

FIG. 10 is a block diagram illustrating an alternative embodiment of the invention. As shown in FIG. 10, the further path comprising circuit 150 may be combined with a main path 162' and an adder 164' in the main path to form a compressor different from that of FIG. 9. As described in U.S. Pat. No. 3,903,485, the above described compressor of FIG. 10 is a Type II compressor. Adder 164' adds the outputs of the two paths to give the compressor output. Similarly, the further path comprising circuit 150 may also be combined with main path 166' and adder 170' as shown in FIG. 10 to form a type II expander. Adder 170' subtracts the further path output from the main path output to give the expander output.

In both the Type I and II arrangements, the compression and expansion characteristics depend on the attenuation applied in the further paths, in other words, on the attenuation characteristics of circuit 150 which in turn depends on the conductance control characteristics of FET 112. As described above, the attenuation or filter characteristics of circuit 150 can be made to conform to a desired predetermined characteristic using control signal modifying circuit 10 of FIGS. 4–7. Hence, if a desired compression or expansion characteristic is defined by combining a further path comprising circuit 100 of FIG. 9 with a main path in either the Type I or II arrangement and with respect to a reference FET characteristic (e.g. FET 112), any compressor or expander with the same type of arrangement but using a FET with characteristics different from that desired may be made (using circuit 10 as shown in FIG. 9) to conform to the desired compression or expansion characteristic by causing the conductance control characteristic of the FET to be used to conform to that of the reference FET characteristic.

The above description of circuit implementation and method is merely illustrative thereof and various changes and arrangements or other details of the method and implementation may be within the scope of the appended claims.

I claim:

1. A circuit for providing a variable resistance whose conductance is a predetermined function of a control signal $V_C$ of the form $F(c(V_C-V_T))$, where c and $V_T$ are desired constants and F a selected function, said resistance suitable for controllably attenuating a signal in a manner in accordance with the predetermined function, said circuit comprising:

a field effect transistor whose drain-source conductance is substantially a function $F(a(V_{GS}-V_P))$ of its gate-source voltage $V_{GS}$, wherein constants a and $V_P$ are different from the desired constants c and $V_T$ respectively, wherein the signal is applied between the drain and source of the transistor; and means for providing a modified control signal by multiplying the control signal by a factor and adding thereto an offset, said modified control signal being applied to the gate of the transistor, said factor and said offset being such that the drain-source conductance of the transistor is substantially the predetermined function of the control signal, so that the signal is controllably attenuated by the transistor in accordance with the predetermined function.

2. The circuit of claim 1, wherein the predetermined function is of the form:

$$G = c(V_C - V_T);$$

where G is the desired conductance.

3. The circuit of claim 2, wherein the drain-source conductance of the field effect transistor is of the form:

$$G_{DS} = a(V_{GS} - V_P);$$

where
$G_{DS}$ is the drain-source conductance of the transistor, and
$V_P$ is the pinch-off voltage of the transistor.

4. The circuit of claim 3, wherein said means for providing a modified control signal comprises:
  means for subtracting the constant $V_T$ from the control signal $V_C$ to provide a difference signal;
  means for multiplying the difference signal by substantially the factor c/a to provide a product signal substantially equal to $c/a(V_C - V_T)$; and
  means for adding $V_P$ to the product signal to derive the modified control signal, so that the modified control signal, when applied to the gate of the transistor, will cause the drain-source conductance of the transistor to be substantially the predetermined function of the control signal $V_C$.

5. The circuit of claim 4, further comprising means for applying substantially half the drain-source voltage of the transistor to the gate of the transistor to reduce distortion.

6. The circuit of claim 3, wherein said modified control signal providing means comprises:
  an amplifier with the control signal applied to the non-inverting input of the amplifier;
  a negative feedback path to the inverting input of the amplifier, said path having an adjustable resistance $R_1$;
  a DC voltage supply;
  a resistor having resistance $R_2$ connecting the DC voltage supply to the inverting input of the amplifier, said resistance $R_1$ adjusted so that the ratio $(R_1 + R_2)/R_2$ is substantially equal to c/a;
  means for adding an offset to the output of the amplifier to derive the modified control signal, said offset selected so that the modified control signal, when applied to the gate of the transistor, will cause the drain-source conductance of the transistor to be substantially the predetermined function of the control signal $V_C$.

7. The circuit of claim 6, wherein said DC voltage supply supplies a DC voltage substantially equal to $V_T$, and said offset is selected to be substantially equal to $(V_P - V_T)$.

8. The circuit of claim 7, wherein the value of $V_T$ is set so that substantially the voltage $V_P$ is applied to the gate of the transistor to simplify a process for adjusting the values of $R_1$ and the offset.

9. The circuit of claim 6, said offset adding means comprises:
  second means for supplying a DC voltage; and
  voltage divider means for deriving the offset from a DC voltage supplied by the second means, said divider having an adjustable resistance path adjusted so that said offset derived is substantially $(V_P - V_T)$.

10. The circuit of claim 9, wherein said second means for supplying a DC voltage comprises:
  a Zener diode with a selected Zener voltage;
  means for biasing the Zener diode so that the diode is operating in its reverse breakdown region, said diode being connected to the output of the amplifier to provide an alternative voltage substantially equal to the output voltage of the amplifier reduced by the Zener voltage.

11. The circuit of claim 10, wherein said voltage divider means comprises a first fixed resistor, a variable resistor and a second fixed resistor connected in series, a node between the first fixed resistor and the variable resistor defining the H node and a node between the second fixed resistor and the variable resistor defining the L node, said two fixed resistors having the other ends connected to the cathode and anode of the diode, so that one of the two nodes H, L will provide the modified control signal at a desired DC level for the transistor.

12. The circuit of claim 11, further comprising means for applying substantially half of the drain-source voltage of the transistor to the gate of the transistor to reduce distortion.

13. The circuit of claim 12, wherein the first and second resistors have substantially the same value and wherein said means for applying half the drain-source voltage comprises:
  means for connecting the gate of the transistor to either the H or L node;
  a third and a fourth resistor of substantially the same value connected in series between the H and L nodes;
  means for applying a multiple of the drain-source voltage of the transistor to the junction between the third and fourth resistors, the value of the third and fourth resistors bearing such ratio to the value of the first and second resistors that half of the drain-source voltage of the transistor is applied to the gate of the transistor.

14. The circuit of claim 11, wherein said first and second resistors have substantially the same resistance.

15. A method for providing a variable resistance whose conductance is a predetermined function of a control signal $V_C$ of the form $F(c(V_C - V_T))$, where c and $V_T$ are constants and F a selected function, said resistance suitable for controllably attenuating a signal in a manner in accordance with the predetermined function, said method comprising:
  providing a field effect transistor whose drain-source conductance is substantially $F(a(V_{GS} - V_P))$ of its gate-source voltage $V_{GS}$, wherein constants a and $V_P$ are different from the desired constants c and $V_T$ respectively;
  applying the signal between the drain and source of the transistor;
  deriving a modified control signal by multiplying the control signal by a factor and adding thereto an offset, said factor and said offset being such that when said modified control signal is applied to the gate of the transistor, the drain-source conductance of the transistor is substantially the predetermined function of the control signal; and
  applying the modified control signal to the gate of the transistor, so that the signal is controllably attenuated by the transistor in accordance with the predetermined function.

16. The method of claim 15, wherein the predetermined function is of the form:

$$G = c(V_C - V_T);$$

where
G is the desired conductance; and wherein the drain-source conductance of the transistor is of the form:

$$G = a(V_{GS} - V_P);$$

where
  $G_{DS}$ is the drain-source conductance of the transistor; and
  $V_P$ is the pinch-off voltage of the transistor; and
wherein said step for providing a modified control signal comprises:
  subtracting the constant $V_T$ from the control signal $V_C$ to provide a difference signal;
  multiplying the difference signal by substantially the factor $c/a$ to provide a product signal substantially equal to $c/a(V_C - V_T)$; and
  adding $V_P$ to the product signal to derive the modified control signal, so that the modified control signal, when applied to the gate of the transistor, will cause the drain-source conductance of the transistor to be substantially the predetermined function of the control signal $V_C$.

17. The method of claim 16, further comprising the step of applying substantially half the drain-source voltage of the transistor to the gate of the transistor to reduce distortion.

18. A circuit for providing a desired attenuator characteristic, said desired attenuator characteristic being defined with respect to a reference field effect transistor whose drain-source conductance is a predetermined function of a control signal $V_C$ applied to the gate of the reference transistor, said function being of the form $F(c(V_C - V_T))$, where c and $V_T$ are desired constants and F a selected function, said circuit comprising:
  a path between an input and an output, said path including an impedance means;
  a second field effect transistor whose drain is connected to the path to shunt the path, and whose drain-source conductance is substantially a function $F(a(V_{GS} - V_P))$ of its gate-source voltage $V_{GS}$, wherein constants a and $V_P$ are different from the desired constants c and $V_T$ respectively; and
  means for providing a modified control signal by multiplying the control signal $V_C$ by a factor and adding thereto an offset, said modified control signal being applied to the gate of the second transistor, said factor and said offset being such that the drain-source conductance of the transistor is substantially the predetermined function of the control signal, so that the transistor and the impedance means provide the desired attenuator characteristic to a signal applied to the input.

19. The circuit of claim 18, wherein the predetermined function is of the form:

$$G = c(V_C - V_T);$$

where G is the desired conductance.

20. The circuit of claim 19, wherein the drain-source conductance of the field effect transistor is of the form:

$$G_{DS} = a(V_{GS} - V_P);$$

where
  $G_{DS}$ is the drain-source conductance of the transistor, and
  $V_P$ is the pinch-off voltage of the transistor.

21. The circuit of claim 20, wherein said means for providing a modified control signal comprises:

means for subtracting the constant $V_T$ from the control signal $V_C$ to provide a difference signal;
  means for multiplying the difference signal by substantially the factor $c/a$ to provide a product signal substantially equal to $c/a(V_C - V_T)$; and
  means for adding $V_P$ to the product signal to derive the modified control signal, so that the modified control signal, when applied to the gate of the transistor, will cause the drain-source conductance of the transistor to be substantially the predetermined function of the control signal $V_C$.

22. The circuit of claim 18, said circuit further comprising means for generating, from the output of the circuit, the control signal $V_C$ for controlling the attenuation of a signal at the input, said control signal generating means and said modified control signal providing means forming a feedback path from the output to the gate of the second transistor.

23. The circuit of claim 22, further comprising a fixed band filter connected between the input and the impedance means to filter input signals to the impedance means.

24. The circuit of claim 23, wherein said fixed band filter is a bandpass filter.

25. The circuit of claim 23, wherein said fixed band filter is a high pass filter.

26. The circuit of claim 23, wherein said fixed band filter is a low pass filter.

27. The circuit of claim 22, further comprising a fixed band filter connected between the output and the drain of the second transistor to filter the output signals of the second transistor.

28. The circuit of claim 27, wherein said fixed band filter is a bandpass filter.

29. The circuit of claim 27, wherein said fixed band filter is a high pass filter.

30. The circuit of claim 27, wherein said fixed band filter is a low pass filter.

31. The circuit of claim 18, wherein said impedance means is a resistor, wherein the circuit is a fixed band filter.

32. The circuit of claim 18, wherein said impedance means is a capacitor, wherein the circuit is a sliding band high pass filter.

33. The circuit of claim 18, wherein said impedance means includes an inductor means, wherein the circuit is a sliding band low pass filter.

34. A circuit for providing a desired compression characteristic where the characteristic is defined with respect to a reference field effect transistor whose drain-source conductance is a predetermined function of a control signal $V_C$ applied to the gate of the reference transistor, said function being of the form $F(c(V_C - V_T))$, where c and $V_T$ are desired constants and F a selected function, said circuit comprising:
  a main signal path which is substantially linear with respect to dynamic range;
  a further signal path which has its input coupled to the input of the main path, said further path including:
    (a) an impedance means connected between the input and output of the further path;
    (b) a second field effect transistor whose drain is connected to the impedance means to shunt the further path, wherein the drain-source conductance of the second transistor is substantially a function $F(a(V_{GS} - V_P))$ of its gate-source voltage $V_{GS}$, wherein constants a and $V_P$ are different from the desired constants c and $V_T$ respectively; and (c) means for providing a modified control signal by multiplying the control signal $V_C$ by a factor and adding thereto an offset, said modified control signal being applied to the gate of the second transistor, said factor and said offset being such that the drain-source conductance of the transistor is substantially the predetermined function of the control signal; and means in the main signal path for adding the outputs of the main and further paths, so that the main path and further path together provide the desired compression characteristic.

35. The circuit of claim 34, wherein the predetermined function is of the form:

$$G=c(V_C-V_T);$$

where G is the desired conductance.

36. The circuit of claim 35, wherein the drain-source conductance of the field effect transistor is of the form:

$$G_{DS}=a(V_{GS}-V_P);$$

where
$G_{DS}$ is the drain-source conductance of the transistor, and
$V_P$ is the pinch-off voltage of the transistor.

37. A circuit for providing a desired expansion characteristic where the characteristic is defined with respect to a reference field effect transistor whose drain-source conductance is a predetermined function of a control signal $V_C$ applied to the gate of the reference transistor, said function being of the form $F(c(V_C-V_T))$, where c and $V_T$ are desired constants and F a selected function, said circuit comprising:

a main signal path which is substantially linear with respect to dynamic range;

a further signal path which has its input coupled to the intput of the main path, said further path including:

(a) an impedance means connected between the input and output of the further path;

(b) a second field effect transistor whose whose drain is connected to the impedance means to shunt the further path, wherein the drain-source conductance of the second transistor is substantially a function $F(a(V_{GS}-V_P))$ of its gate-source voltage $V_{GS}$, wherein constants a and $V_P$ are different from the desired constants c and $V_T$ respectively; and (c) means for providing a modified control signal by multiplying the control signal $V_C$ by a factor and adding thereto an offset, said modified control signal being applied to the gate of the second transistor, said factor and said offset being such that the drain-source conductance of the transistor is substantially the predetermined function of the control signal; and means in the main signal path for subtracting the outputs of the main and further paths, so that the main and further paths together provide the desired expansion characteristic.

38. The circuit of claim 37, wherein the predetermined function is of the form:

$$G=c(V_C-V_T);$$

where G is the desired conductance.

39. The circuit of claim 38, wherein the drain-source conductance of the field effect transistor is of the form:

$$G_{DS}=a(V_{GS}-V_P);$$

where
$G_{DS}$ is the drain-source conductance of the transistor, and
$V_P$ is the pinch-off voltage of the transistor.

40. A circuit for providing a desired compression characteristic where the characteristic is defined with respect to a reference field effect transistor whose drain-source conductance is a predetermined function of a control signal $V_C$ applied to the gate of the reference transistor, said function being of the form $F(c(V_C-V_T))$, where c and $V_T$ are desired constants and F a selected function, said circuit comprising:

a main signal path which is substantially linear with respect to dynamic range;

a further signal path which has its input coupled to the output of the main path, said further path including:

(a) an impedance means connected between the input and output of the further path;

(b) a second field effect transistor whose drain is connected to the impedance means to shunt the further path, wherein the drain-source conductance of the second transistor is substantially a function $F(a(V_{GS}-V_P))$ of its gate-source voltage $V_{GS}$, wherein constants a and $V_P$ are different from the desired constants c and $V_T$ respectively; and (c) means for providing a modified control signal by multiplying the control signal $V_C$ by a factor and adding thereto an offset, said modified control signal being applied to the gate of the second transistor, said factor and said offset being such that the drain-source conductance of the transistor is substantially the predetermined function of the control signal; and means in the main signal path for adding the outputs of the main and further paths, so that the main path and further path together provide the desired compression characteristic.

41. The circuit of claim 40, wherein the predetermined function is of the form:

$$G=c(V_C-V_T);$$

where G is the desired conductance.

42. The circuit of claim 41, wherein the drain source conductance of the field effect transistor is of the form:

$$G_{DS}=a(V_{GS}-V_P);$$

where
$G_{DS}$ is the drain-source conductance of the transistor, and
$V_P$ is the pinch-off voltage of the transistor.

43. A circuit for providing a desired expansion characteristic where the characteristic is defined with respect to a reference field effect transistor whose drain-source conductance is a predetermined function of a control signal $V_C$ applied to the gate of the reference transistor, said function being of the form $F(c(V_C - V_T))$, where c and $V_T$ are desired constants and F a selected function, said circuit comprising:

a main signal path which is substantially linear with respect to dynamic range;

a further signal path which has its input coupled to the output of the main path, said further path including:

(a) an impedance means connected between the input and output of the further path;

(b) a second field effect transistor whose drain is connected to the impedance means to shunt the further path, wherein the drain-source conductance of the second transistor is substantially a function $F(a(V_{GS} - V_P))$ of its gate-source voltage $V_{GS}$, wherein constants a and $V_P$ are different from the desired constants c and $V_T$ respectively; and (c) means for providing a modified control signal by multiplying the control signal $V_C$ by a factor and adding thereto an offset, said modified control signal being applied to the gate of the second transistor, said factor and said offset being such that the drain-source conductance of the transistor is substantially the predetermined function of the control signal; and means in the main signal path for subtracting the outputs of the main and further paths, so that the main and further paths together provide the desired expansion characteristic.

44. The circuit of claim 43, wherein the predetermined function is of the form:

$$G = c(V_C - V_T);$$

where G is the desired conductance.

45. The circuit of claim 44, wherein the drain-source conductance of the field effect transistor is of the form:

$$G_{DS} = a(V_{GS} - V_P);$$

where $G_{DS}$ is the drain-source conductance of the transistor, and $V_P$ is the pinch-off voltage of the transistor.

* * * * *

UNITED STATES PATENT AND TRADEMARK OFFICE
CERTIFICATE OF CORRECTION

PATENT NO. : 4,766,395
DATED : Aug. 23, 1988
INVENTOR(S) : Dolby

It is certified that error appears in the above-identified patent and that said Letters Patent is hereby corrected as shown below:

Col. 15, line 1 :  "G=" should be --$G_{DS}$=--;
Col. 16, line 46: "indludes" should be --includes--;
Col. 17, line 45: delete "whose";
Col. 17, line 41: "intput" should be --input--; and
Col. 18, line 54: "drain source" should be --drain-source--.

Signed and Sealed this

Fourteenth Day of February, 1989

*Attest:*

DONALD J. QUIGG

*Attesting Officer*    *Commissioner of Patents and Trademarks*